United States Patent
Brew et al.

(10) Patent No.: US 10,651,379 B2
(45) Date of Patent: May 12, 2020

(54) THREE-TERMINAL METASTABLE SYMMETRIC ZERO-VOLT BATTERY MEMRISTIVE DEVICE

(71) Applicant: INTERNATIONAL BUSINESS MACHINES CORPORATION, Armonk, NY (US)

(72) Inventors: Kevin W. Brew, Albany, NY (US); Talia S. Gershon, White Plains, NY (US); Seyoung Kim, White Plains, NY (US); Dennis M. Newns, Yorktown Heights, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/241,284

(22) Filed: Jan. 7, 2019

(65) Prior Publication Data

US 2019/0157552 A1    May 23, 2019

Related U.S. Application Data

(63) Continuation of application No. 15/832,300, filed on Dec. 5, 2017, now Pat. No. 10,186,657, which is a (Continued)

(51) Int. Cl.
*G11C 13/00* (2006.01)
*H01L 45/00* (2006.01)

(52) U.S. Cl.
CPC ...... *H01L 45/1206* (2013.01); *G11C 13/0002* (2013.01); *G11C 13/004* (2013.01);
(Continued)

(58) Field of Classification Search
CPC ............ G11C 13/0002; G11C 13/0069; G11C 13/004
See application file for complete search history.

(56) References Cited

U.S. PATENT DOCUMENTS 8,270,200 B2    9/2012  Wu et al.
8,415,652 B2    4/2013  Yang et al.
(Continued)

FOREIGN PATENT DOCUMENTS

CN        1911490 A      2/2007
CN      206282860 U      6/2017
(Continued)

OTHER PUBLICATIONS

List of IBM Patents or Patent Applications Treated as Related dated Jan. 7, 2019, 2 pages.
(Continued)

*Primary Examiner* — Huan Hoang
*Assistant Examiner* — Jay W. Radke
(74) *Attorney, Agent, or Firm* — Tutunjian & Bitetto, P.C.; Vazken Alexanian

(57) ABSTRACT

A method of fabricating a memristive structure for symmetric modulation between resistance states is presented. The method includes forming a first electrode and a second electrode over an insulating substrate, forming an anode contacting the first and second electrodes, forming an ionic conductor over the anode, forming a cathode of the same material as the anode over the ionic conductor, forming a third electrode over the cathode, and enabling bidirectional transport of ions between the anode and cathode resulting in a resistance adjustment of the memristive structure, the
(Continued)

anode and the cathode being formed from metastable mixed conducting materials with ion concentration dependent conductivity.

16 Claims, 6 Drawing Sheets

Related U.S. Application Data continuation of application No. 15/616,320, filed on Jun. 7, 2017, now Pat. No. 10,340,447.

(52) U.S. Cl.
CPC ...... *G11C 13/0011* (2013.01); *G11C 13/0069* (2013.01); *H01L 45/085* (2013.01); *H01L 45/1226* (2013.01); *H01L 45/1266* (2013.01); *H01L 45/147* (2013.01); *H01L 45/16* (2013.01); *H01L 45/1608* (2013.01); *G11C 2013/005* (2013.01); *G11C 2013/009* (2013.01); *G11C 2013/0052* (2013.01); *G11C 2013/0066* (2013.01); *G11C 2013/0092* (2013.01); *G11C 2213/53* (2013.01)

(56) References Cited

U.S. PATENT DOCUMENTS

| | | | |
|---|---|---|---|
| 8,466,445 | B2 | 6/2013 | Campbell et al. |
| 9,118,006 | B1 | 8/2015 | Campbell |
| 10,083,974 | B1* | 9/2018 | Huang ............... H01L 45/1233 |
| 2007/0195580 | A1* | 8/2007 | Hoenigschmid ......... G11C 7/02 365/148 |
| 2008/0259680 | A1* | 10/2008 | Nishide ................. B82Y 10/00 365/174 |
| 2012/0280224 | A1 | 11/2012 | Doolittle et al. |
| 2013/0140648 | A1* | 6/2013 | Hasegawa .......... H01L 45/1233 257/411 |
| 2015/0079481 | A1 | 3/2015 | Sun et al. |

FOREIGN PATENT DOCUMENTS

| | | |
|---|---|---|
| WO | 2015/199706 A1 | 12/2015 |
| WO | 2016171700 A1 | 10/2016 |
| WO | 2016184113 A1 | 11/2016 |

OTHER PUBLICATIONS

Burns et al., "Introducing Symmetric Li-Ion Cells as a Tool to Study Cell Degradation Mechanisms." Journal of The Electrochemical Society. vol. 158, No. 12, Nov. 7, 2011. pp. A1417-A1422.

Fuller et al., "Li-Ion Synaptic Transistor for Low Power Analog Computing," Advanced Science News. Advanced Materials 2017. vol. 29, Issue 4. Jan. 25, 2017.

Greenlee et al., "In-situ oxygen x-ray absorption spectroscopy investigation of the resistance modulation mechanism in LiNbo2 memristors," Applied Physics Letters, vol. 100, Issue 18. May 4, 2012. pp. 1-4.

Khatun et al., "Impact of Lithium Composition on Structural, Electronic and Optical Properties of Lithium Cobaltite Prepared by Solid-State Reaction," Journal of Scientific Research. vol. 6. Issue 2. Apr. 24, 2014. pp. 217-231.

Li et al., "Two-phase transition of Li-intercalation compounds in Li-ion batteries," Materials Today, vol. 17. No. 9. Nov. 2014. pp. 451-463.

Mai et al., "Memristive and neuromorphic behavior in a $LixCoO_2$ nanobattery," Scientific Reports. vol. 5. No. 7761. Jan. 14, 2015. pp. 1-6.

Shi et al., "Colossal resistance switching and band gap modulation in a preovskite nickelate by electron doping," Nature Communications. vol. 5. No. 4860. Sep. 3, 2014. pp. 1-9.

Tsai et al., "Atomistic Structure and Ab Initio Electronchemical Properties of $Li_4Ti_5O_{12}$ Defect Spinel for Li Ion Batteries," Journal of the Electrochemical Society. vol. 161, Issue 3. Jan. 16, 2014. pp. A439-A444.

Van Der Ven et al., "Understanding Li Diffusion in Li-Intercalation Compounds," Accounts of Chemical Research. vol. 46. No. 5. May 14, 2012. pp. 1216-1225.

Young et al., "Electronic Conductivity in the $Li_4/3Ti_5/3O_4$—$Li_7/3Ti_5/3O_4$ System and Variation with State-of-Charge as a Li Battery Anode," Advanced Energy Materials. Materials Views. vol. 3. Issue 9. Sep. 10, 2013. pp. 1125-1129.

International Search Report and Written Opinion in corresponding International Patent Application No. PCT/IB2018/053936 dated Sep. 29, 2018 (pp. 1-11).

Office Action in corresponding German Patent Application No. 112018001828.8 dated Nov. 19, 2019 (pp. 1-7).

* cited by examiner

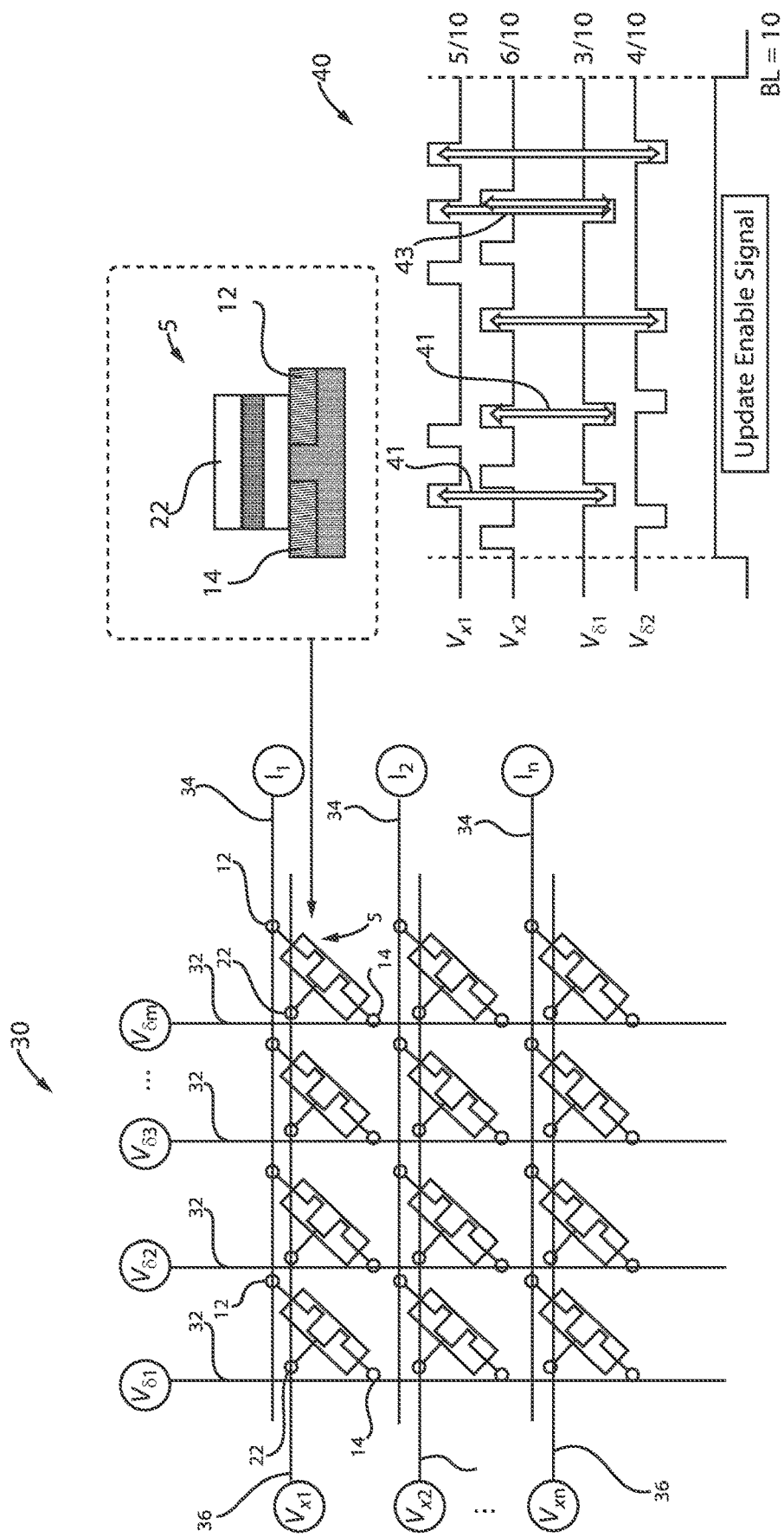

THREE-TERMINAL METASTABLE SYMMETRIC ZERO-VOLT BATTERY MEMRISTIVE DEVICE

BACKGROUND

Technical Field

The present invention relates generally to semiconductor devices, and more specifically, to a three-terminal metastable symmetric zero-volt battery memristive device.

Description of the Related Art

A memristive device is an electronic device that can change conductivity. For example, the memristive device can provide a high conductivity state when a first voltage is applied to the memristive device, and the memristive device can provide a low conductivity state when a second voltage is applied to the memristive device. A memristive device can be constructed from a memristive material that provides two or more conductivity states after electroformation or conditioning. A memristive device can be utilized in a variety of electronic applications such as, but not limited to, nonvolatile storage, memory arrays, 3-D memory, switching, reconfigurable and rapidly-tunable bandpass and notch filters, reversible field programmable fuse arrays, sample and hold elements, programmable resistance elements within a variable-gain amplifier, and analog to digital converters, and the like. Additionally, a memristive device can be integrated with other electronic components.

SUMMARY

In accordance with an embodiment, a method of fabricating a memristive structure for symmetric modulation between resistance states is provided. The method includes forming a first electrode (e.g., source) and a second electrode (e.g., drain) over an insulating substrate, forming an anode contacting the first and second electrodes, forming an ionic conductor over the anode, forming a cathode of the same material as the anode over the ionic conductor, forming a third electrode (e.g., a gate electrode) over the cathode, and enabling bidirectional transport of ions between the anode and cathode formed from the same mixed conducting material resulting in a resistance adjustment of the initial mixed conductor layer, the anode and the cathode being formed from metastable mixed conducting materials with ion concentration dependent conductivity.

In accordance with an embodiment, a memristive structure for symmetric modulation between resistance states is provided. The memristive structure includes a first electrode and a second electrode formed over an insulating substrate, an anode contacting the first and second electrodes, an ionic conductor formed over the anode, a cathode of the same material as the anode formed over the ionic conductor, and a third electrode formed over the cathode. The anode and the cathode are formed from ion-intercalated metastable materials enabling bidirectional transport of ions between the anode and cathode resulting in a resistance adjustment of the initial mixed conductor layer.

In accordance with an embodiment, a memristive structure for symmetric modulation between resistance states is provided. The memristive structure includes an ionic conductor formed between a metastable anode and a metastable cathode and electrodes formed adjacent the metastable anode and cathode. Symmetric modulation between resistance states results from bidirectional transfer of ions between the metastable anode and cathode including the same mixed conducting material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 4 is a physical array of the three-terminal memristive device of FIG. 1 for a resistive processing unit (RPU) implementation, in accordance with the present invention;

FIG. 5 is a graphic illustrating resistance switching for the RPU implementation, in accordance with the present invention;

Throughout the drawings, same or similar reference numerals represent the same or similar elements.

DETAILED DESCRIPTION

Figure 1:
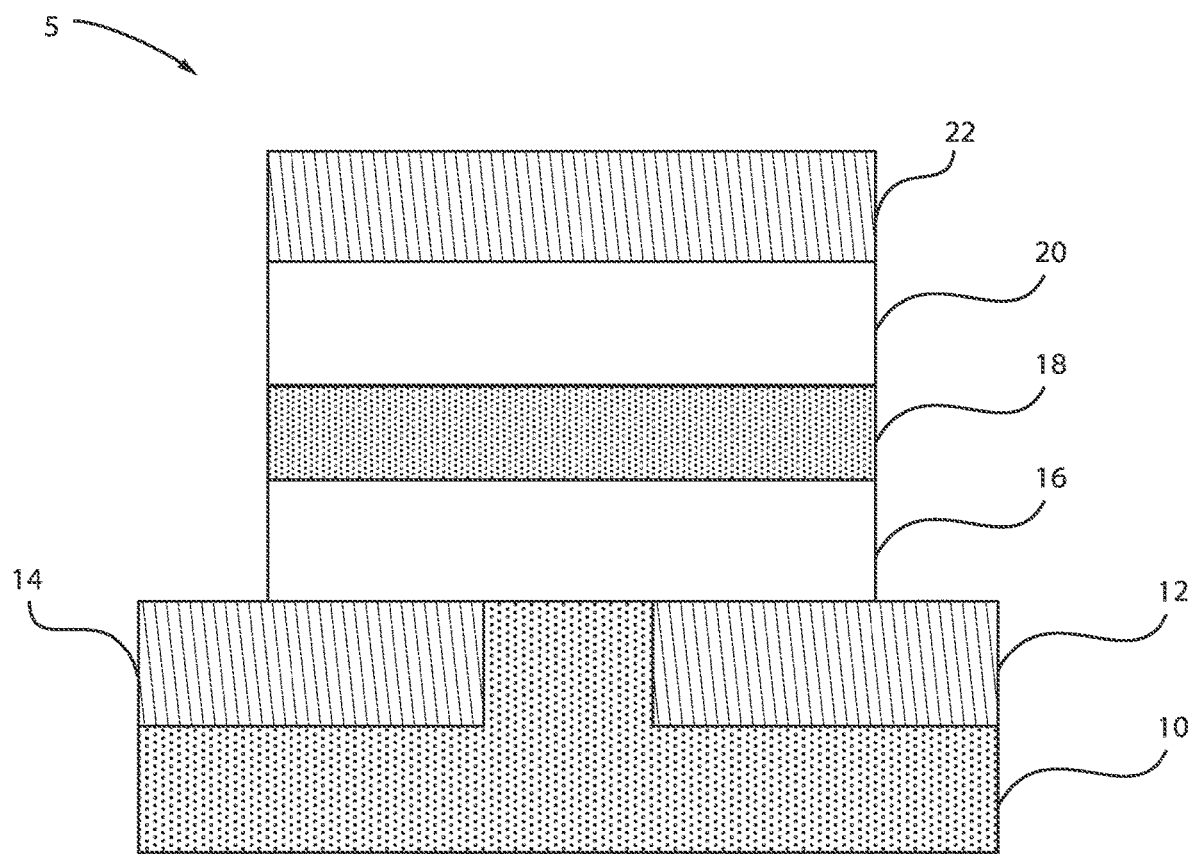
FIG. 1 is a cross-sectional view of a three-terminal memristive device, in accordance with the present invention.

Embodiments in accordance with the present invention provide methods and devices for a three-terminal memristive device. In general, a memristive device is a hypothetical non-linear passive electrical component relating electric charge and magnetic flux linkage. The memristor's electrical resistance is not constant but depends on the history of current that had previously flowed through the device, e.g., its present resistance depends on how much electric charge has flowed in what direction through it in the past. Usually, an external switch is needed to prevent reverse discharge in the memristive device. The main characteristics of a memristive device are analog modulation, decoupled read/write operations, bidirectional modulation, and symmetric modulation. The three-terminal memristive device of the exemplary embodiments is constructed with metastable materials or layers of the same conducting material such that symmetrical modulation is achieved between resistance states without the use of an external switch, since resistance adjustment or resistance switching occurs due to the transfer or transport of ions between the metastable layers without building in EMF/voltage.

Embodiments in accordance with the present invention provide methods and devices for a three-terminal memristive device that achieves symmetric modulation between resistance states. Resistance needs to be symmetrically modulated for machine learning to occur in a backpropagation trained neural network comprised of these devices. For symmetric modulation to occur, the memristive device needs to include metastability, that is, a phase separation that is necessary to achieve a constant chemical potential of mobile ions between reservoirs (e.g., metastable anode and cathode layers). The exemplary embodiments introduce a three terminal memristive device, where an electrically insulating electrolytic layer is formed between a metastable anode and a metastable cathode. Ions get reversibly moved from the cathode into/out of the anode and the source and/or drain (S/D) voltage gives a current depending on ion concentration in the channel. Movement of ions between the metastable anode and the metastable cathode provide for resistance adjustment or switching within the memristive device, such that symmetrical modulation is achieved. Additionally, a chemical potential of the ions between the metastable anode and the metastable cathode is maintained near zero.

Embodiments in accordance with the present invention provide methods and devices for a three-terminal memristive device where the read and write operations are separated for the memristive device, thus allowing the read and write operations to occur simultaneously, while preventing the write operation to read to the device.

Memory cells are common constituents of integrated circuitry. An individual memory cell includes a device that exists in two or more stable memory states. The act of "writing" to the device includes placing the device into a desired memory state and the act of "reading" the device includes determination of which of the memory states the device is in.

The writing to the device can include imparting a programming voltage to the device, with the programming voltage being a voltage sufficient to cause the device to change from one memory state to another. The reading of the device can include measurement of an electrical parameter influenced by the memory state of the device, such as, for example, measurement of current passing through the device. It can be desired that the reading be conducted under conditions which do not alter the memory state of the device, so that the reading operation does not "write" to the device. The three-terminal memristive device of the exemplary embodiments prevents such unwanted operations, and thus prevents reverse discharge.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps and/or blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

FIG. 1 is a cross-sectional view of a three-terminal memristive device, in accordance with the present invention.

Structure 5 includes a substrate 10. A first electrode 12 (or source) and a second electrode 14 (or drain) are formed within the substrate 10. An anode 16 is formed over a portion of the first and second electrodes 12, 14. An ionic conductor 18 (or ionic conducting layer 18) is formed over the anode 16. The ionic conductor 18 can be, e.g., an electrolyte. A cathode 20 is then formed over the ionic conductor 18. The anode 16 and the cathode 20 can be formed from metastable materials. The anode 16 and the cathode 20 can be formed from the same metastable materials. A third electrode 22 (or gate electrode) is formed over the cathode 20. Thus, the structure 5 is a three-terminal memristive device. One skilled in the art may contemplate reversing the order of electrodes. For example, the first and second electrodes can be positioned or placed adjacent the cathode 20 and the third electrode can be positioned or placed adjacent the anode 16. The anode 16 and the cathode 20 can be referred to as metastable mixed conducting layers. The anode and the cathode layers 16, 20 are dependent on a concentration of a mobile intercalated ion. The anode and the cathode layers 16, 20 are of the same metastable material.

In one or more embodiments, the substrate 10 can be, for example, an insulator or insulating material.

The first, second, and third electrodes 12, 14, and 22 can be formed from inert metals. The inert metals can be, e.g., platinum (Pt), gold (Au), iridium (Ir), etc. The inert metals won't oxidize during anneal at about 500° C. in air. In one exemplary embodiment, Pt is preferred when using lithium cobalt oxide ($LiCoO_2$) as the metastable material in the anode 16 and the cathode 20 as it reduces the necessary temperature for forming metastable phase separated mixed ionic-electronic conductors (MIEC) HT-LiCoO$_2$ films.

The anode 16 and the cathode 20 can be formed from metastable materials, such as, e.g., MIEC. A metastable phase is a phase which is locally stable with respect to small fluctuations. Metastable materials have a spinodal stability limit between a bimodal equilibrium curve that defines the metastable region. Within the stability limit, there is a miscibility gap that defines thermodynamically unstable compositions for the material, thus, the material forms two phases of varying concentrations defined by the stability and temperature. The metastable MIEC can include, e.g., lithium cobalt oxide (Li$_x$CoO$_2$), lithium niobate (Li$_x$NbO$_3$), doped Li$_{4+x}$Ti$_5$O$_{12}$ (LTO), lithium titanate (Li$_x$TiO$_2$), lithium samarium nickelate (Li$_x$SmNiO$_3$), etc. The thickness of the anode 16 and the cathode 20 can be, e.g., about 50 nm to about 1000 nm. The anode 16 and the cathode 20 are chosen such that they change the resistance based on ion concentration, as described further below. The initial ion concentrations of the anode 16 and the cathode 20 are selected or tuned to ensure that the anode 16 and the cathode 20 are metastable. Thus, chemical or electrical dilithiation can be used to tune or adjust the initial concentrations of the metastable anode 16 and the metastable cathode 20. Metastability allows for symmetric switching between states and is important for non-volatility. Stated differently, symmetric modulation between resistance states results from bidirectional transfer of ions between the metastable anode and cathode including the same mixed conducting material.

The solid state electrolyte layer 18 can be formed to be in contact with the anode layer 16 and the cathode layer 20, and can be configured to electrically isolate the anode layer 16 from the cathode layer 20. In one example, the electrolyte layer 18 can be, for example, a lithium phosphorus oxynitride (LiPON).

Suitable materials for the electrolyte layer 18 can further include, but are not limited to, ethylene carbonate and diethyl carbonate containing lithium ion complexes, and other (e.g., acid or alkali) electrolytes having suitable ion transport properties. In lithium ion applications of microbatteries, the electrolyte 18 is usually non-aqueous, in order to avoid reacting with lithium metal components in anode 16 and cathode 20 and to further avoid evaporation during cathode annealing.

Suitable anode 16 and cathode 20 materials include, but are not limited to, lithium, lithium cobalt oxide, lithium iron phosphate and other lithium metal phosphates, lithium manganese oxide, carbon, and graphite, or graphite infused with lithium ions.

Each of the layers (e.g., anode 16, cathode 20, electrolyte 18) can be formed using conventional vacuum deposition techniques, which enables direct encapsulation of reactive layers prior to any ambient exposure. Exemplary methods include chemical or physical vapor deposition, flash evaporation, laser ablation and co-evaporation. Physical vapor deposition (PVD) methods can include, for example, reactive or non-reactive sputtering processes. With sputtering, any conventional power supply can be used to generate the ion (e.g., Art) current to the target, for example, magnetron, DC, or pulsed DC power supplies. Suitable sputter targets for the various barrier layer compositions can be formed as melted powder or pressed powder targets.

Figure 2:
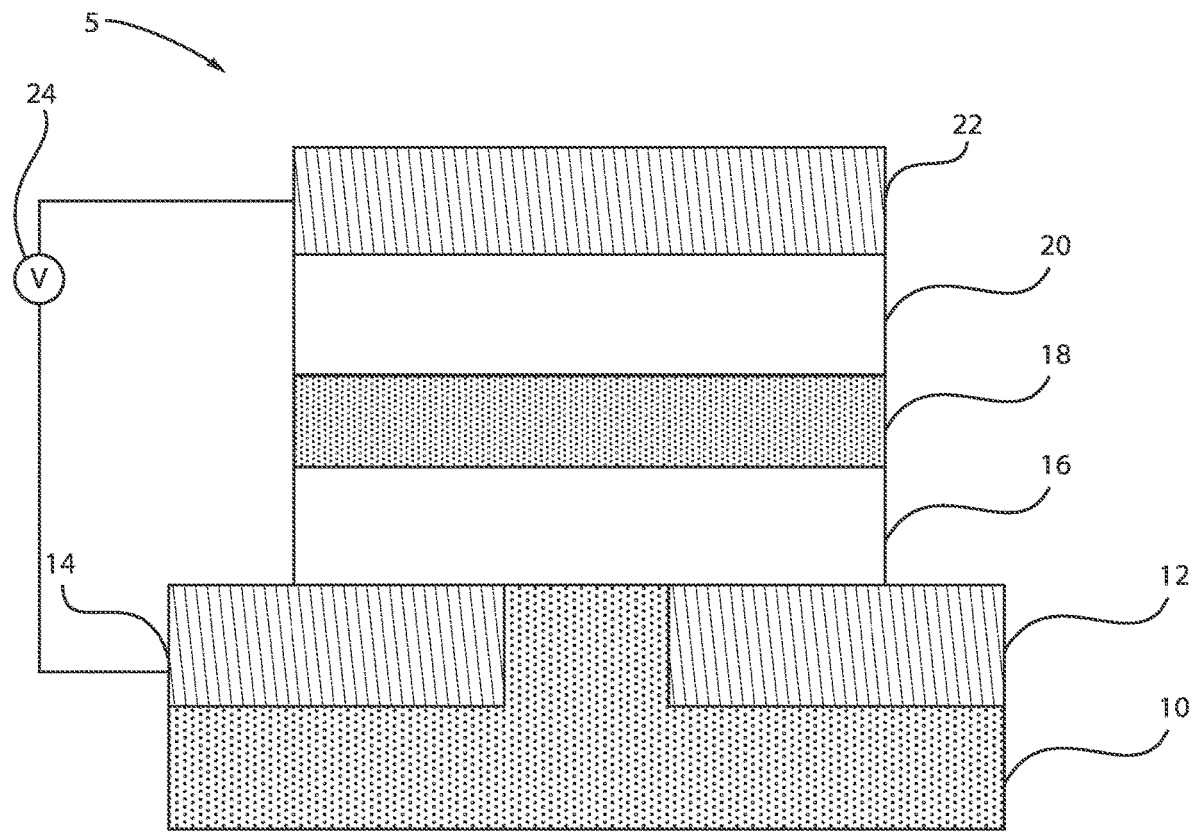
FIG. 2 is a cross-sectional view of the memristive device of FIG. 1 where electrical pulses are applied between a top electrode and a bottom electrode of the three-terminal memristive device to enable a write operation, in accordance with the present invention.

FIG. 2 is a cross-sectional view of the memristive device of FIG. 1 where electrical pulses are applied between a top electrode and a bottom electrode of the three-terminal memristive device to enable a write operation, in accordance with the present invention.

In various embodiments, a voltage source 24 is connected between the second electrode 14 and the third electrode 22 to provide electrical pulses therebetween to enable a write operation. The voltage source 24 can also be connected between the first electrode 12 and the third electrode 22 to provide electrical pulses therebetween to enable the write operation. The electrical pulses cause transfer or ions (or interstitial ions) between the anode 16 and the cathode 20. Due to the three-terminal construction of the memristive device, the read and write operations are separated for the device, thus allowing the read and write operations to occur simultaneously, while preventing unwanted reading of the device.

Figure 3:
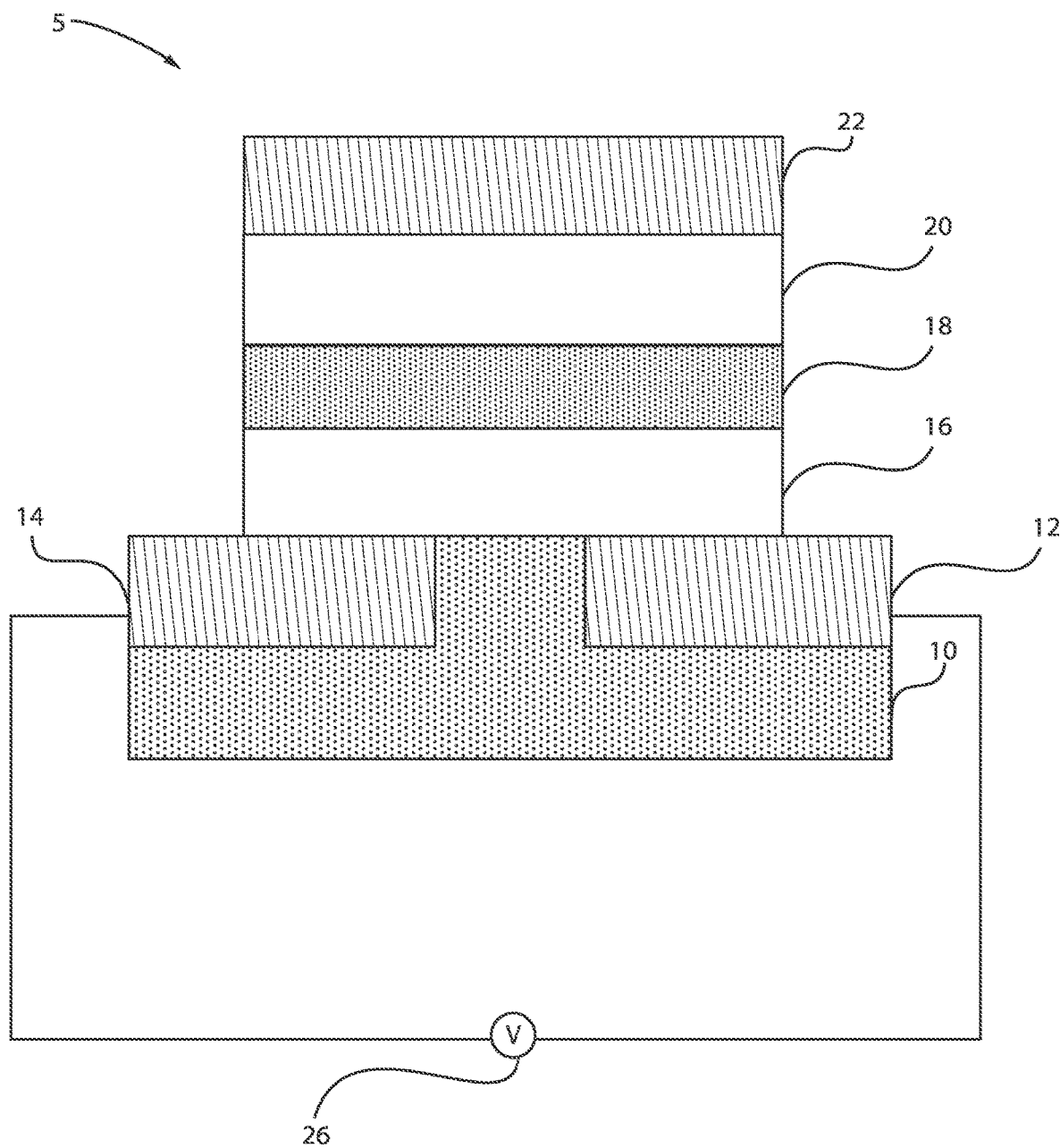
FIG. 3 is a cross-sectional view of the memristive device of FIG. 1 where electrical pulses are applied between the bottom electrodes of the three-terminal memristive device to enable a read operation, in accordance with the present invention.

FIG. 3 is a cross-sectional view of the memristive device of FIG. 1 where electrical pulses are applied between the bottom electrodes of the three-terminal memristive device to enable a read operation, in accordance with the present invention.

In various embodiments, a voltage source 26 is connected between the first electrode 12 and the second electrode 14 to provide electrical pulses therebetween to enable a read operation. The electrical pulses cause transfer or ions (or interstitial ions) between the anode 16 and the cathode 20. The relative concentration of ions in the anode 16 controls the read resistance of the memristive device. Once again, due to the three-terminal construction of the memristive device, the read and write operations are separated for the device, thus allowing the read and write operations to occur simultaneously, while preventing unwanted reading of the device.

Therefore, in FIGS. 1-3, no external field effect transistor (FET) switch is needed to prevent reverse discharge. Instead, bidirectional movement of ions between the anode 16 and the cathode 20 results in resistance adjustment of the memristive structure 5. The resistance adjustment involves resistive switching for maintaining the symmetric modulation between the resistance states. Moreover, a chemical potential of the ions between the anode 16 and the cathode 20 is maintained near zero.

FIG. 4 is a physical array of the three-terminal memristive device of FIG. 1 for a resistive processing unit (RPU) implementation, in accordance with the present invention.

The physical array 30 is a rectangular array of memristive devices 5 in which a set of x-lines and a set of y-lines are connected by a memristive device 5 at every x-y intersection. The array can be an m×n array configured to be modified accordingly per the designer's needs. This constitutes a Resistive Processing Unit (RPU) for use in a hardware embodiment, e.g., such as a neural network.

The first electrode 12 is connected to a current line 34, the second electrode 14 is connected to a voltage line 32, and the third electrode 22 is connected to a voltage line 36. Applying a low read bias to the voltage line 32 induces a current on the line 34.

FIG. 5 is a graphic illustrating resistance switching for the RPU implementation, in accordance with the present invention.

The graphic 40 depicts electrical pulses applied between electrodes of the memristor device 5. Arrows 41 illustrate the memristive device 5 in a first resistance state and arrows 43 illustrate the memristive device 5 switching over to a second resistance state. Thus, constant ion movement between the anode 16 and the cathode 20 results in resistance switching to maintain a chemical potential difference of ions at or near zero. The reversible adjustment at zero EMF of ion concentrations between layers 16, 20 enable symmetric resistance states to be maintained during operation of the memristive devices 5.

Figure 6:
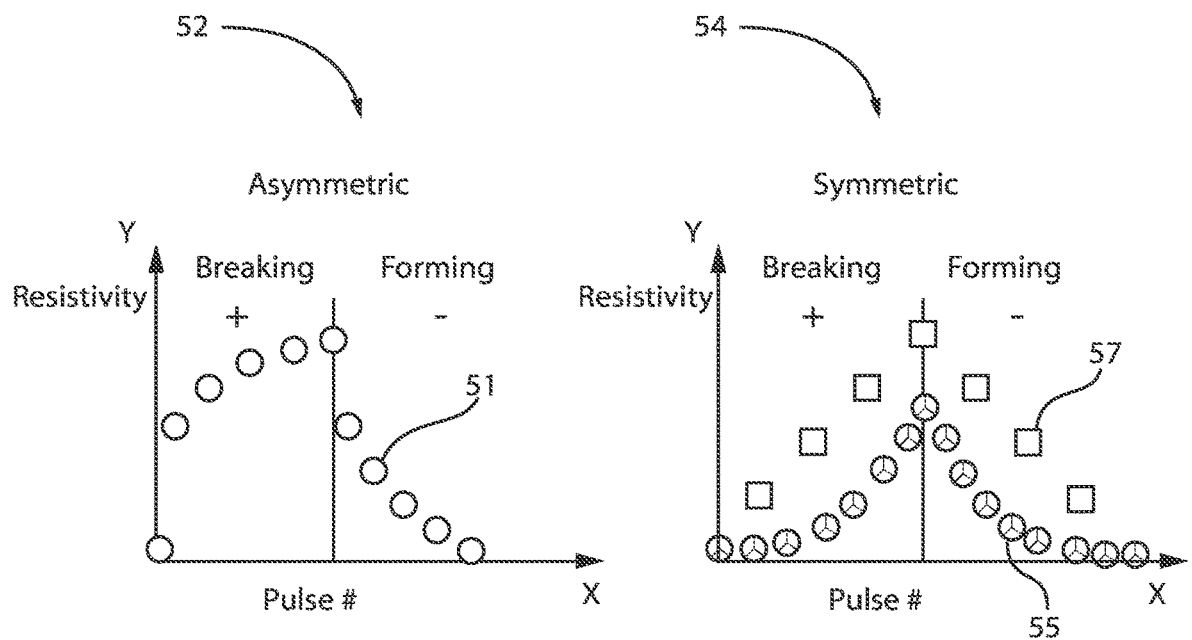
FIG. 6 is a graph illustrating asymmetric and symmetric modulation between resistance states, in accordance with the present invention.

FIG. 6 is a graph illustrating asymmetric and symmetric modulation between resistance states, in accordance with the present invention.

The graph on the left-hand side depicts asymmetric modulation 52 and the graph on the right-hand side depicts symmetric modulation 54. Asymmetric curve 51 is shown for the asymmetric modulation 52. Symmetric curves 55, 57 are shown for the symmetric modulation 54. The exemplary embodiments of the present invention achieve symmetric modulation. For machine learning to occur on the memristive device the resistance needs to be symmetrically modulated. In other words, when provided with n positive pulses, n negative pulses returns the device to the same resistance. In order to achieve symmetric modulation between resistance states, each state of the memristive device needs to have an equal potential. Thus, the memristive device needs to include metastability, that is, phase separation is needed to achieve a constant chemical potential of mobile ions between reservoirs (e.g., anode 16 and cathode 20).

Figure 7:
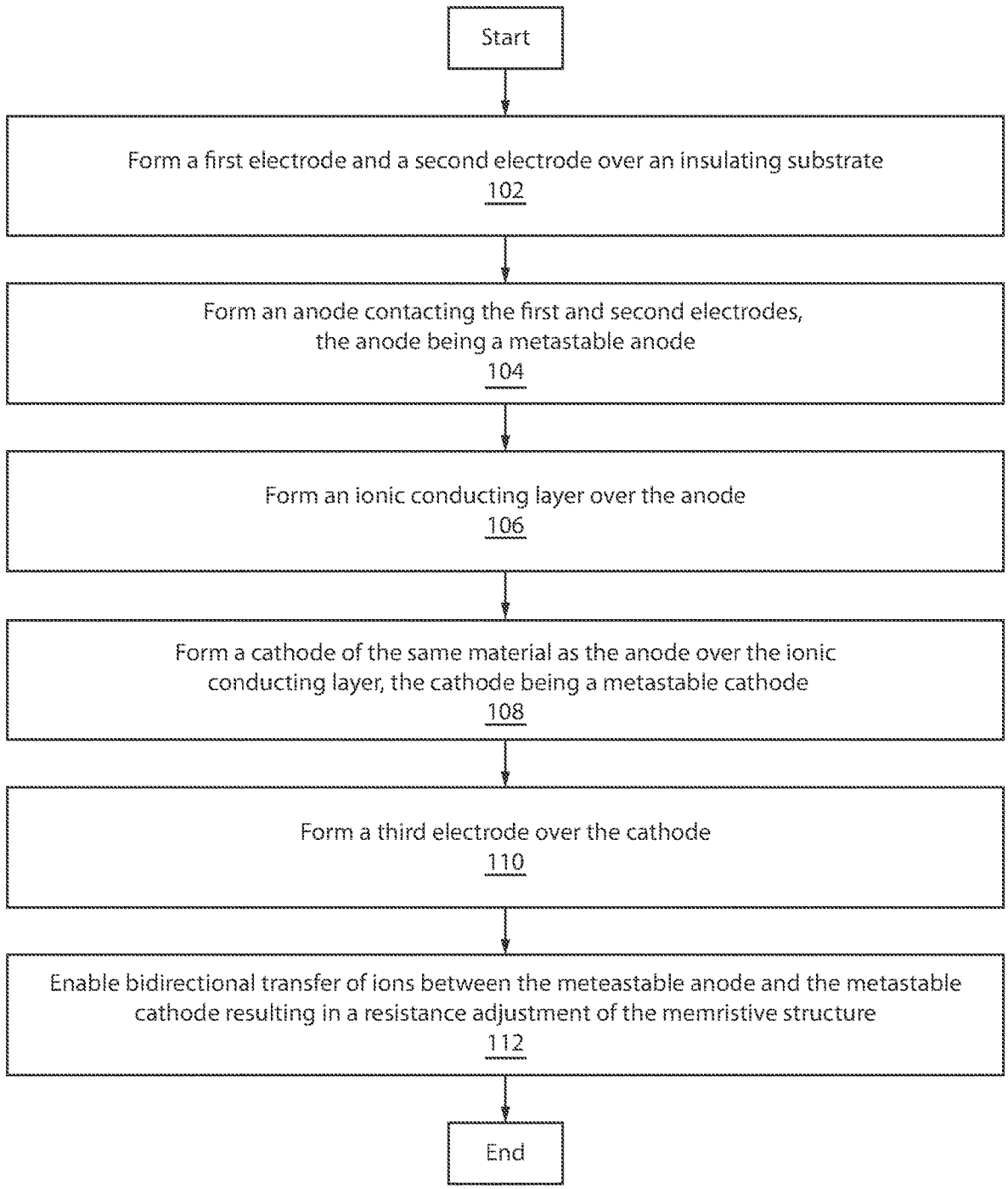
FIG. 7 is block/flow diagram of a method for fabricating a memristive structure for symmetric modulation between resistance states, in accordance with the present invention.

FIG. 7 is block/flow diagram of a method for fabricating a memristive structure for symmetric modulation between resistance states, in accordance with the present invention.

At block 102, a first electrode and a second electrode are formed over an insulating substrate. The first electrode and the second electrode can be formed from inert metals.

At block 104, an anode is formed contacting the first and second electrodes, the anode being a metastable MIEC forming channel.

At block 106, an ionic conductor is formed over the MIEC forming channel. The ionic conductor can be, e.g., an electrolyte.

At block 108, a cathode of the same material as the anode is formed over the ionic conductor, the cathode being a metastable cathode.

At block 110, a third electrode is formed over the cathode. The third electrode can be formed from, e.g., an inert metal.

At block 112, bidirectional movement of ions is enabled between the metastable anode and the metastable cathode resulting in a resistance adjustment of the memristive structure. The resistance adjustment involves resistance switching for maintaining the symmetric modulation between the resistance states. A chemical potential difference of ions between the metastable anode and the metastable cathode is maintained at or near zero to provide for the symmetric modulation. The anode and the cathode can also be referred to as reservoirs of mobile ions, where the ions can drift/diffuse in both directions (e.g., to and from the anode/cathode). The equal potential and electrolyte prevent back diffusion. The ions are moved from anode to cathode by drift of the ions in an applied electric field. It is noted that only ions are transferred or transported between the metastable anode and cathode layers. The three-terminal memristive structure does not require any external FET switching mechanism to provide non-volatility of the resistance states. The three-terminal memristive device can be used, e.g., as a neuron in a neural network.

It is to be understood that the present invention will be described in terms of a given illustrative architecture; however, other architectures, structures, substrate materials and process features and steps and/or blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for fabricating a memristive structure for symmetric modulation between resistance states (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of providing symmetric modulation between resistance states of a memristive device, the method comprising:
   forming a first electrode and a second electrode each directly contacting an insulation substrate therein;
   forming an anode contacting the first and second electrodes;
   forming an ionic conductor over the anode;
   forming a cathode over the ionic conductor; and
   enabling bidirectional transport of ions between the anode and cathode resulting in a resistance adjustment of the memristive structure,
   wherein the anode and the cathode are formed from metastable materials and wherein the metastable materials are metastable phase separated mixed ionic-electronic conductors (MIEC) whose conductivity is dependent on a concentration of an intercalated mobile ion, and
   wherein the resistance adjustment involves resistance switching that maintains the symmetric modulation between the resistance states.

2. The method of claim 1, further comprising forming a third electrode over the cathode.

3. The method of claim 2, wherein electrical pulses are applied between the first electrode and the third electrode or between the second electrode and the third electrode to enable a write operation.

4. The method of claim 1, wherein the first and second electrodes are formed from inert metals.

5. The method of claim 1, wherein electrical pulses are applied between the first and second electrodes to enable a read operation.

6. The method of claim 1, wherein a movement of the ions is enabled by application of a voltage to enable concurrent operation of read and write operations.

7. The method of claim 1, wherein a chemical potential difference of ions between the anode and the cathode is maintained near zero.

8. The method of claim 1, wherein the first and second electrodes are substantially planar.

9. A method for providing symmetric modulation between resistance states of a memristive device, the method comprising:
   forming a first electrode and a second electrode each directly contacting an insulating substrate therein, the first and second electrodes being substantially planar;
   forming an anode contacting the first and second electrodes;
   forming an ionic conductor over the anode;
   forming a cathode over the ionic conductor, where a chemical potential difference of ions between the anode and the cathode is maintained near zero; and
   enabling bidirectional transport of ions between the anode and cathode resulting in a resistance adjustment of the memristive structure,
   wherein electrical pulses are applied between the first and second electrodes to enable a read operation.

10. The method of claim 9, further comprising forming a third electrode over the cathode.

11. The method of claim 10, wherein electrical pulses are applied between the first electrode and the third electrode or between the second electrode and the third electrode to enable a write operation.

12. The method of claim 9, wherein the anode and the cathode are formed from metastable materials.

13. The method of claim 12, wherein the metastable materials are metastable phase separated mixed ionic-electronic conductors (MIEC) whose conductivity is dependent on a concentration of an intercalated mobile ion.

14. The method of claim 9, wherein the resistance adjustment involves resistance switching for maintaining the symmetric modulation between the resistance states.

15. The method of claim 9, wherein the first and second electrodes are formed from inert metals.

16. The method of claim 9, wherein a movement of the ions is enabled by application of a voltage to enable concurrent operation of read and write operations.

* * * * *